(12) United States Patent
Merrill

(10) Patent No.: US 7,745,773 B1
(45) Date of Patent: Jun. 29, 2010

(54) MULTI-COLOR CMOS PIXEL SENSOR WITH SHARED ROW WIRING AND DUAL OUTPUT LINES

(75) Inventor: Richard B. Merrill, Woodside, CA (US)

(73) Assignee: Foveon, Inc., San Jose, CA (US)

( * ) Notice: Subject to any disclaimer, the term of this patent is extended or adjusted under 35 U.S.C. 154(b) by 82 days.

(21) Appl. No.: 12/101,879

(22) Filed: Apr. 11, 2008

(51) Int. Cl.
*H01L 27/00* (2006.01)
*H01J 40/14* (2006.01)

(52) U.S. Cl. .............................. 250/208.1; 250/214 R

(58) Field of Classification Search ............. 250/208.1, 250/214 R, 214.1; 348/272–283, 294, 297–304
See application file for complete search history.

(56) References Cited

U.S. PATENT DOCUMENTS

| | | |
|---|---|---|
| 3,971,065 A | 7/1976 | Bayer |
| 4,011,016 A | 3/1977 | Layne et al. |
| 4,238,760 A | 12/1980 | Carr |
| 4,309,604 A | 1/1982 | Yoshikawa et al. |
| 4,318,115 A | 3/1982 | Yoshikawa et al. |
| 4,613,895 A | 9/1986 | Burkey et al. |
| 4,651,001 A | 3/1987 | Harada et al. |
| 4,677,289 A | 6/1987 | Nozaki et al. |
| 4,772,335 A | 9/1988 | Huang |
| 5,397,734 A | 3/1995 | Iguchi et al. |
| 5,502,299 A | 3/1996 | Standley |
| 5,608,243 A | 3/1997 | Chi et al. |
| 5,668,596 A | 9/1997 | Vogel |
| 5,739,562 A | 4/1998 | Ackland et al. |
| 5,872,371 A | 2/1999 | Guidash et al. |
| 5,883,421 A | 3/1999 | Chouikha et al. |

(Continued)

FOREIGN PATENT DOCUMENTS

EP 0 605 898 A1 7/1994

(Continued)

OTHER PUBLICATIONS

B.C. Burkey et al., "The Pinned Photodiode for an Interline-Transfer CCD Image Sensor," 1984 IEDM Tech Digest, p. 28-31, Dec. 1984, IEEE, N.Y., USA.

(Continued)

*Primary Examiner*—Georgia Y Epps
*Assistant Examiner*—Pascal M Bui-Pho
(74) *Attorney, Agent, or Firm*—Lewis and Roca LLP

(57) ABSTRACT

An array of multicolor CMOS pixel sensors has a plurality of photosensors per pixel, each photosensor coupled to a single sense node through a select transistor having a select input, each pixel sensor including a reset transistor coupled to the sense node and having a reset input, an amplifier coupled to the sense node and a row-select transistor coupled to the amplifier. The select inputs and the reset inputs for pixel sensors in a pair of adjacent rows are coupled to select signal lines and reset signal lines associated with the pair of rows. The amplifier transistors in individual columns of each row are coupled to a column output line through a row-select transistor having a row-select input. The row-select inputs for pixel sensors in each row of the array are coupled to a row-select line associated with the row.

4 Claims, 7 Drawing Sheets

U.S. PATENT DOCUMENTS

| | | | |
|---|---|---|---|
| 5,889,315 | A | 3/1999 | Farrenkopf et al. |
| 5,899,714 | A | 5/1999 | Farrenkopf et al. |
| 5,949,061 | A | 9/1999 | Guidash et al. |
| 5,965,875 | A | 10/1999 | Merrill |
| 6,066,510 | A | 5/2000 | Merrill |
| 6,078,037 | A | 6/2000 | Booth, Jr. |
| 6,107,655 | A * | 8/2000 | Guidash .................... 257/233 |
| 6,111,300 | A | 8/2000 | Cao et al. |
| 6,410,899 | B1 | 6/2002 | Merrill et al. |
| 6,518,558 | B1 | 2/2003 | Bohm et al. |
| 6,727,521 | B2 | 4/2004 | Merrill |
| 6,731,397 | B1 | 5/2004 | Merrill et al. |
| 6,852,562 | B1 | 2/2005 | Hopper et al. |
| 6,960,757 | B2 | 11/2005 | Merrill et al. |
| 7,218,347 | B2 * | 5/2007 | Shinohara ................... 348/272 |
| 7,382,010 | B2 * | 6/2008 | Choi .......................... 257/292 |
| 7,542,085 | B2 * | 6/2009 | Altice et al. ................ 348/296 |
| 2002/0058353 | A1 | 5/2002 | Merrill |
| 2004/0185597 | A1 | 9/2004 | Merrill et al. |

FOREIGN PATENT DOCUMENTS

| | | |
|---|---|---|
| EP | 0 605 898 B1 | 7/1994 |
| EP | 0 707 417 A2 | 4/1996 |
| EP | 0 707 417 A3 | 4/1996 |
| JP | 61-187282 A1 | 8/1986 |
| JP | 01-134966 A1 | 5/1989 |
| WO | 98/19455 A1 | 5/1998 |

OTHER PUBLICATIONS

S. Chamberlain, "Photosensitivity and Scanning of Silicon Image Detector Arrays," IEEE Journal of Solid-State Circuits, vol. SC-4, No. 6, pp. 333-342, Dec. 1969, IEEE, N.Y., USA.

S. Chamberlain et al., "Technology Progress and Trends in Solid-State Silicon Image Sensors," IEEE 1985 Custom Integrated Circuits Conference, pp. 112-118, Rochester, New York, 1985, no month, IEEE, N.Y., USA.

M. Chouikha, "Color sensitive photodetectors in standard CMOS and BiCMOS technologies," SPIE, vol. 2950, pp. 108-118, Aug. 1996, Bellingham, WA, USA.

M. Chouikha, "Buried Triple p-n Junction Structure in a BiCMOS Technology for Color Detection," IEEE BCTM 6.4, pp. 108-111, Sep. 1997, IEEE, N.Y., USA.

P. B. Denyer et al., "CMOS Image Sensors for Multimedia Applications," IEEE 1993 Custom Integrated Circuits Conference, pp. 11.5.1 to 11.5.4, 1993, IEEE, N.Y., USA.

R. Guidash, "A 0.6 um CMOS Pinned Photodiode Color Imager Technology," IEDM, pp. 927-929, 1997, no month, IEEE, N.Y., USA.

D. Knipp et al, "Low Cost Approach to Realize Novel Detectors for Color Recognition," Proc. ICPS 98 (International Congress on Imaging Science), pp. 350-353, Sep. 1998.

J. Kramer, "Photo-ASICs: Integrated Optical Metrology Systems with Industrial CMOS Technology," Doctorial Dissertation: Diss Eth Nr. 10186. MSc Imperial College of Science and Technology, pp. 2-91, 1993.

H. Miura et al, "A 100 Frame/s CMOS Active Pixel Sensor for 3D-Gesture Recognition System," 1999 IEEE International Solid-State Circuits Conference, pp. 142-143, Jun. 1999, IEEE, N.Y., USA.

K. Parulski et al, "Enabling technologies for a family of digital cameras," SPIE, vol. 2654, pp. 156-163, 1996, no month.

P. Seitz et al., "Smart optical and image sensors fabricated with industrial CMOS/CCD semiconductor processes," SPIE, vol. 1900, pp. 21-30, Jul. 1993, Bellingham, WA, USA.

H. Stiebig et al., "Transient Behavior of Optimized nipiin Three-Color Detectors," IEEE Transactions on Electron Devices, vol. 45, No. 7, pp. 1438-1443, Jul. 1998, IEEE, N.Y., USA, N.Y., USA.

D. Sutherland, "Neaveau Niche—Part 1: The Latest in digital SLRs," Shutterbug, 5 pages, Nov. 1997, Titusville, FL, USA.

A. Theuwissen, "Fundamentals of Solid-State Imaging," Solid-State Imaging with Charge-coupled Devices, pp. 131-141, 1995 Reprinted with corrections 1996, 1997.

B. Weibel, "High-end digital cameras can make professional indoor photography a snap," Buyers Guide, 8 pages, Apr. 1997.

R. Wolffenbuttel et al., "A Novel Approach to Solid-State Colour Sensing," Senors and Actuactors, vol. 9, pp. 199-211, 1986, no month.

R. Wolffenbuttel et al., "Performance of an Integrated Silicon Colour Sensors with a Digital Output in Terms of Response to Colours in the Colour Triangle," Sensor and Actuators, vol. A21-A23, pp. 574-580, 1990, no month.

H. Wong, "Technology and Device Scaling Considerations for CMOS Imagers", IEEE Transactions on Electron Devices, vol. 43, No. 12, pp. 2131-2142, Dec. 1996, IEEE, N.Y., USA.

* cited by examiner

US 7,745,773 B1

MULTI-COLOR CMOS PIXEL SENSOR WITH SHARED ROW WIRING AND DUAL OUTPUT LINES

BACKGROUND OF THE INVENTION

1. Field of the Invention

The present invention relates to multi-color CMOS pixel sensors. More particularly, the present invention relates to multi-color CMOS pixel sensors with shared row wiring and dual output lines.

2. The Prior Art

Multi-color CMOS pixel sensors are known in the art. Such pixel sensors are often configured with more than one photodiode per color. This type of pixel sensor has a unique challenge that the pixel needs lots of wires compared to a conventional CMOS pixel sensor because photodiodes are stacked increasing the number of photodiodes per unit area. The number of wires are a problem because as the pixel sizes shrink there is less room for a large number of signal routing through the pixel array. There also is a trend to using fewer layers of metal as the pixels get smaller to improve the optical stack between the microlens to the photodiodes. This problem is further complicated by the fact that certain wires need to move through the array in different directions and each metal layer is only useful for moving in one direction through the array unless the layer the wire is running on changes to other layers to avoid congestion. The output wires are usually considered column wires in the art and run in one direction through the array. The row enable and color enable lines have to run through the array perpendicular to the output lines and this is considered the row direction through the array. The row and color enable signals are usually different for each row of the sensor to enable proper sharing of the column output signal and the photocharge collection node. The reset signal also has to run in the row direction through the array to enable rolling shutter readout and reset and is also unique for each row of the sensor.

The power signals Vpix and SFD can usually run in either direction through the array since they global signals and the same for the complete array. These power signals are usually run in the column direction since only the column output signal runs in that direction. For pixel architectures that have multiple photodiodes sharing a common photocharge collection node, amplifier and row enable transistor, like those described here, there can be a lot more signals that need to be routed through the array in the row direction than in the column direction.

BRIEF DESCRIPTION OF THE INVENTION

The present invention provides two different ways to reduce the number of required wires through the pixel array. The first adds another column output wire and reduces the number color enable, reset, and row enable signals. This embodiment adds another column wire and reduces the number of row signals from eight to four per row in the implementation described. The second embodiment also reduces the number of color select signals required by half, but does not add another column output signal.

According to one aspect of the present invention, an array of multicolor CMOS pixel sensors has a plurality of photosensors per pixel, each photosensor coupled to a single sense node through a select transistor having a select input, each pixel sensor including a reset transistor coupled to the sense node and having a reset input, an amplifier coupled to the sense node and a row-select transistor coupled to the amplifier. The select inputs for pixel sensors in a pair of adjacent rows are coupled to select signal lines associated with the pair of rows. The amplifier transistors in individual columns of each row are coupled to a column output line through a row-select transistor having a row-select input. The row-select and reset inputs for pixel sensors in each row of the array are coupled to a row-select and reset lines associated with the row.

According to another aspect of the present invention, an array of CMOS pixel sensors, has a plurality of photosensors per pixel, each photosensor coupled to a sense node through a select transistor having a select input, each pixel sensor including a reset transistor coupled to the sense node and having a reset input, an amplifier coupled to the sense node and a row-select transistor coupled to the amplifier. The select inputs for pixel sensors in a pair of adjacent rows are coupled to select signal lines associated with the pair of rows. The reset inputs for pixel sensors in the pair of adjacent rows are coupled to reset signal lines associated with the pair of rows. The amplifier transistors in individual columns of pixel sensors in odd rows are coupled to a first column line through an odd row-select transistor having an odd row-select input and the amplifiers in the individual columns of pixel sensors in even rows are coupled to a second column line through an even row-select transistor having an even row-select input. The odd and even row-select inputs for pixel sensors in the pair of adjacent rows are coupled to a row-select line associated with the pair of rows.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
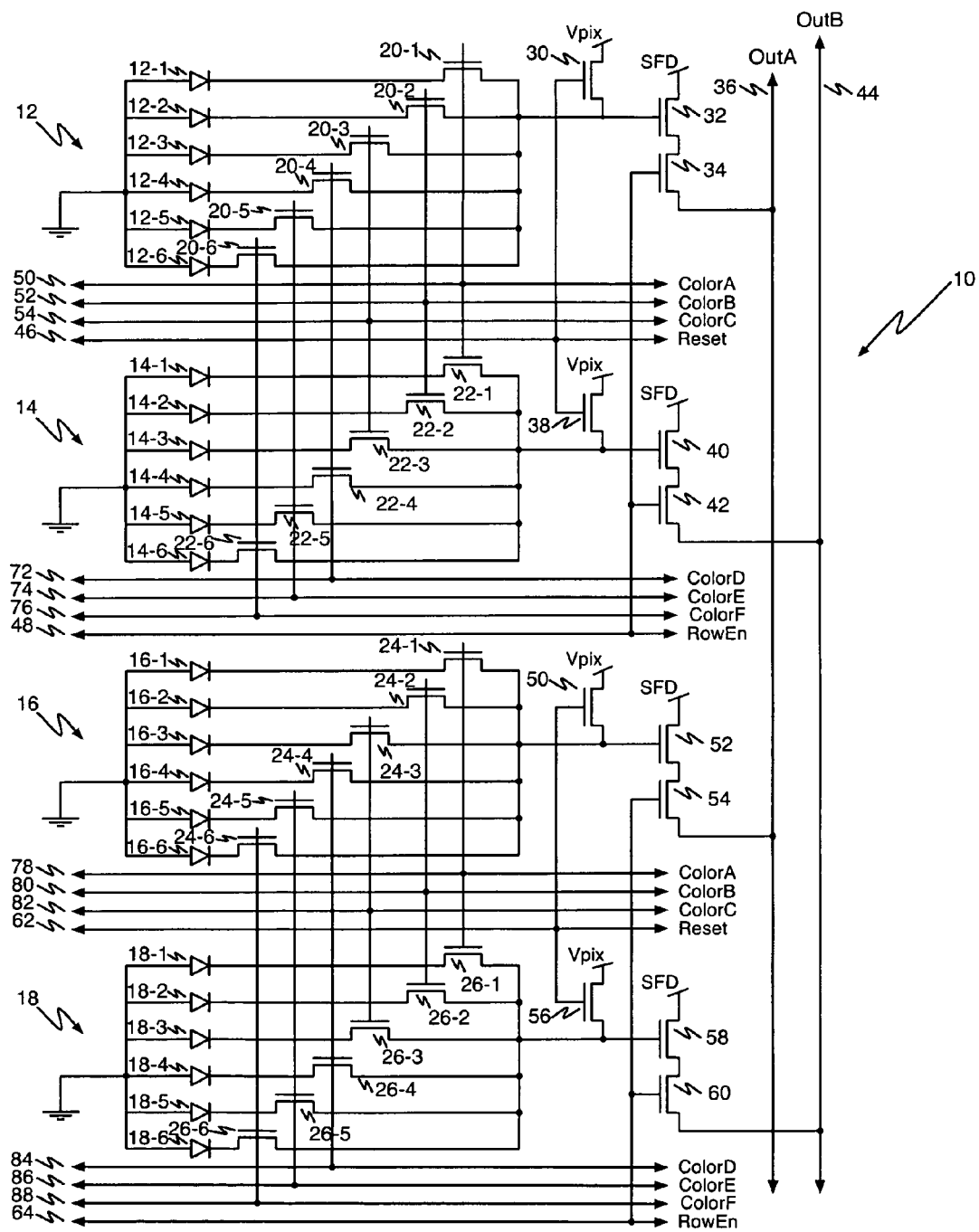
FIG. 1 is a schematic diagram of a portion of a column of multi-color CMOS pixel sensors according to one aspect of the present invention.

Referring first to FIG. 1, a schematic diagram shows a portion of an array 10 of multi-color CMOS pixel sensors according to the present invention comprising a part of a single column of the array containing four multi-color CMOS pixel sensors 12, 14, 16, and 18. Each pixel sensor includes six photodiodes identified in FIG. 1 at reference numerals 12-1 through 12-6, 14-1 through 14-6, 16-1 through 16-6, and 18-1 through 18-6. The anode of each photodiode is coupled to ground.

The cathode of each photodiode is separately coupled to a source/drain terminal of an n-channel select transistor to form a photocharge collection node. In pixel sensor 12, transistors 20-1 through 20-6 are the select transistors for photodiodes 12-1 through 12-6 respectively. In pixel sensor 14, transistors 22-1 through 22-6 are the select transistors for photodiodes 14-1 through 14-6 respectively. In pixel sensor 16, transistors 24-1 through 24-6 are the select transistors for photodiodes 16-1 through 16-6 respectively. In pixel sensor 18, transistors 26-1 through 26-6 are the select transistors for photodiodes 18-1 through 18-6 respectively.

As shown in FIG. 1, the other source/drain terminals of select transistors 20-1 through 20-6 are coupled to the source of reset transistor 30 and the gate of source-follower transistor 32. The drain of reset transistor 30 is coupled to a reset potential $V_{pix}$. The drain of source-follower transistor 32 is coupled to a potential SFD. The source of source-follower transistor 32 is coupled to the drain of an output select transistor 34. The source of output select transistor 34 is coupled to a first output column line 36. The other source/drain terminals of select transistors 22-1 through 22-6 are coupled to the source of reset transistor 38 and the gate of source-follower transistor 40. The drain of reset transistor 38 is coupled to a reset potential $V_{pix}$. The drain of source-follower transistor 40 is coupled to a potential SFD. The source of source-follower transistor 40 is coupled to the drain of an output select transistor 42. The source of output select transistor 42 is coupled to a second output column line 44. The gates of reset transistors 30 and 38 are coupled together to a reset line 46. The gates of output select transistors 34 and 42 are coupled together to a row-enable line 48.

Similarly, the other source/drain terminals of select transistors 24-1 through 24-6 are coupled to the source of reset transistor 50 and the gate of source-follower transistor 52. The drain of reset transistor 50 is coupled to a reset potential $V_{pix}$. The drain of source-follower transistor 52 is coupled to a potential SFD. The source of source-follower transistor 52 is coupled to the drain of an output select transistor 54. The source of output select transistor 54 is coupled to the first output column line 36. The other source/drain terminals of select transistors 26-1 through 26-6 are coupled to the source of reset transistor 56 and the gate of source-follower transistor 58. The drain of reset transistor 56 is coupled to a reset potential $V_{pix}$. The drain of source-follower transistor 58 is coupled to a potential SFD. The source of source-follower transistor 58 is coupled to the drain of an output select transistor 60. The source of output select transistor 60 is coupled to the second output column line 44. The gates of reset transistors 50 and 56 are coupled together to a reset line 62. The gates of output select transistors 54 and 60 are coupled together to a row-enable line 64.

Sets of four control lines run adjacent to each row in the array. As shown in FIG. 1, each set includes three color-select lines and one control line. The first set shown in FIG. 1 includes color-select lines 50, 52, and 54, and reset line 46. The second set shown in FIG. 1 includes color-select lines 72, 74, and 76, and row-enable line 48. The third set shown in FIG. 1 includes color-select lines 78, 80, and 82, and reset line 62. The fourth set shown in FIG. 1 includes color-select lines 84, 86, and 88, and row-enable line 64.

The gates of the n-channel select transistors are coupled to the color-select lines. The connections to the color-select lines are arranged such that colors from adjacent pixels may be read out together. Color-select line 50 is coupled to the gates of select transistors 20-1 and 22-1. Color-select line 52 is coupled to the gates of select transistors 20-2 and 22-2. Color-select line 54 is coupled to the gates of select transistors 20-3 and 22-3.

In similar fashion, color-select line 72 is coupled to the gates of select transistors 20-4 and 22-4. Color-select line 74 is coupled to the gates of select transistors 20-5 and 22-5. Color-select line 76 is coupled to the gates of select transistors 20-6 and 22-6. Color-select line 78 is coupled to the gates of select transistors 24-1 and 26-1. Color-select line 80 is coupled to the gates of select transistors 24-2 and 26-2. Color-select line 82 is coupled to the gates of select transistors 24-3 and 26-3. Color-select line 84 is coupled to the gate of select transistor 24-4 and 26-4. Color-select line 86 is coupled to the gate of select transistor 24-5 and 26-5. Color-select line 88 is coupled to the gate of select transistor 24-6 and 26-6.

Figure 2:
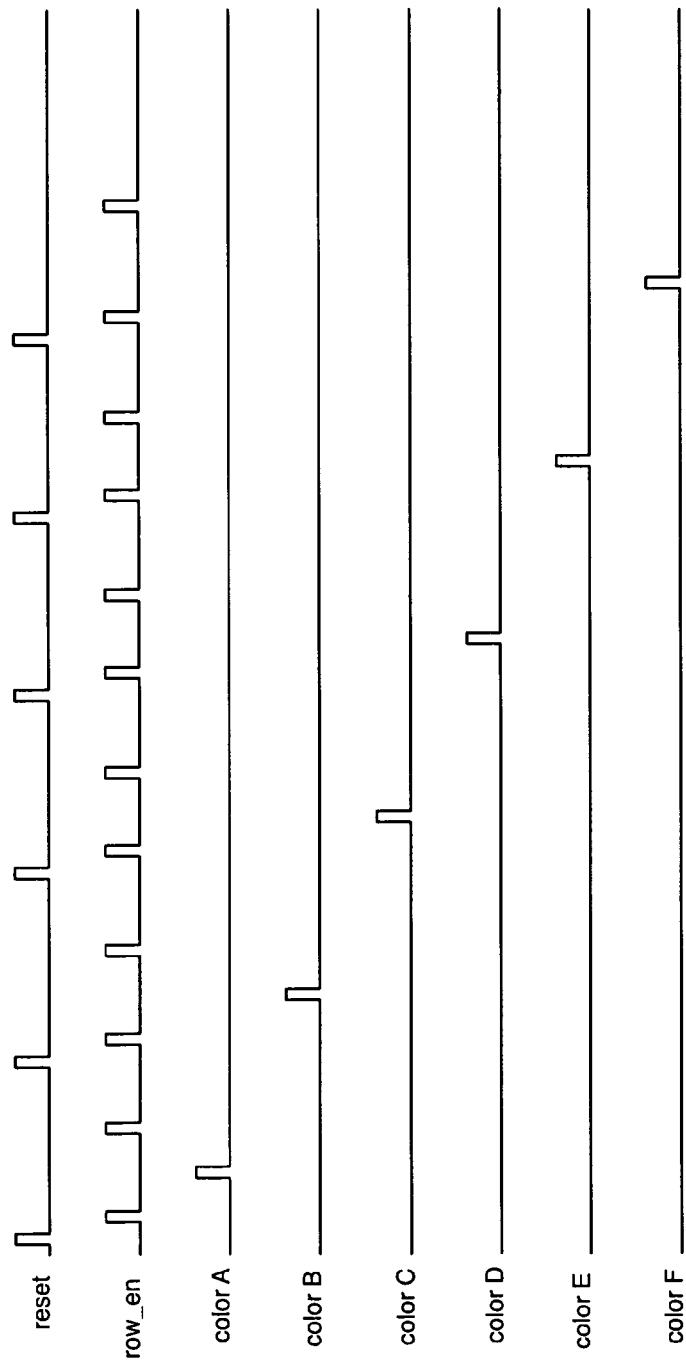
FIG. 2 is a timing diagram illustrating one method for operating the pixel sensor of FIG. 1.

Row-enable lines 48 and 64 and reset lines 46 and 62 are driven at different times. Referring now to FIG. 2, a timing diagram illustrates one method for operating the pixel sensor of FIG. 1. To read out photodiodes 12-1 and 14-1 which are read out at the same time, first the reset signal 46 is asserted to reset the sense nodes (gates of the source follower 32 and 40) to a known potential. After the reset signal 46 is deasserted then the RowEn signal 48 is asserted. This provides the dark signal for a correlated double sample on output column lines 36 and 44. Then the ColorA signal 50 is asserted and deasserted which transfers the values on photodiodes 12-1 and 14-1 onto the sense node for pixel 12 and pixel 14 respectively. These two values are then enabled onto the column output lines 36 and 44 by asserting RowEn 48. This then provides the light signal for photodiodes 12-1 and 14-1. The dark signal is subtracted from the light signal, in column circuits, well know in the art, to get the pixel output values.

To read out photodiodes 12-2 and 14-2 which are read out at the same time, first the reset signal 46 is asserted to reset the sense nodes (gates of the source follower 32 and 40) to a known potential. After the reset signal 46 is deasserted then the RowEn signal 48 is asserted. This provides the dark signal for a correlated double sample on output column lines 36 and 44. Then the ColorB signal 52 is asserted and deasserted which transfers the values on photodiodes 12-2 and 14-2 onto the sense node for pixel 12 and pixel 14 respectively. These two values are then enabled onto the column output lines 36 and 44 by asserting RowEn 48. This then provides the light signal for photodiodes 12-2 and 14-2. The dark signal is subtracted from the light signal, in column circuits, well known in the art, to get the pixel output values.

To read out photodiodes 12-3 and 14-3 which are read out at the same time, first the reset signal 46 is asserted to reset the sense nodes (gates of the source follower 32 and 40) to a known potential. After the reset signal 46 is deasserted then the RowEn signal 48 is asserted. This provides the dark signal for a correlated double sample on output column lines 36 and 44. Then the ColorC signal 54 is asserted and deasserted which transfers the values on photodiodes 12-3 and 14-3 onto the sense node for pixel 12 and pixel 14 respectively. These two values are then enabled onto the column output lines 36 and 44 by asserting RowEn 48. This then provides the light signal for photodiodes 12-3 and 14-3. The dark signal is subtracted from the light signal, in column circuits, well known in the art, to get the pixel output values.

To read out photodiodes 12-4 and 14-4 which are read out at the same time, first the reset signal 46 is asserted to reset the sense nodes (gates of the source follower 32 and 40) to a known potential. After the reset signal 46 is deasserted then the RowEn signal 48 is asserted. This provides the dark signal for a correlated double sample on output column lines 36 and 44. Then the ColorD signal 72 is asserted and deasserted which transfers the values on photodiodes 12-4 and 14-4 onto the sense node for pixel 12 and pixel 14 respectively. These two values are then enabled onto the column output lines 36 and 44 by asserting RowEn 48. This then provides the light signal for photodiodes 12-4 and 14-4. The dark signal is subtracted from the light signal, in column circuits, well known in the art, to get the pixel output values.

To read out photodiodes 12-5 and 14-5 which are read out at the same time, first the reset signal 46 is asserted to reset the sense nodes (gates of the source follower 32 and 40) to a known potential. After the reset signal 46 is deasserted then the RowEn signal 48 is asserted. This provides the dark signal for a correlated double sample on output column lines 36 and 44. Then the ColorE signal 74 is asserted and deasserted which transfers the values on photodiodes 12-5 and 14-5 onto the sense node for pixel 12 and pixel 14 respectively. These two values are then enabled onto the column output lines 36 and 44 by asserting RowEn 48. This then provides the light signal for photodiodes 12-5 and 14-5. The dark signal is subtracted from the light signal, in column circuits, well known in the art, to get the pixel output values.

To read out photodiodes 12-6 and 14-6 which are read out at the same time, first the reset signal 46 is asserted to reset the sense nodes (gates of the source follower 32 and 40) to a known potential. After the reset signal 46 is deasserted then the RowEn signal 48 is asserted. This provides the dark signal for a correlated double sample on output column lines 36 and 44. Then the ColorF signal 76 is asserted and deasserted which transfers the values on photodiodes 12-6 and 14-6 onto the sense node for pixel 12 and pixel 14 respectively. These two values are then enabled onto the column output lines 36 and 44 by asserting RowEn 48. This then provides the light signal for photodiodes 12-6 and 14-6. The dark signal is subtracted from the light signal, in column circuits, well known in the art, to get the pixel output values.

Figure 3:
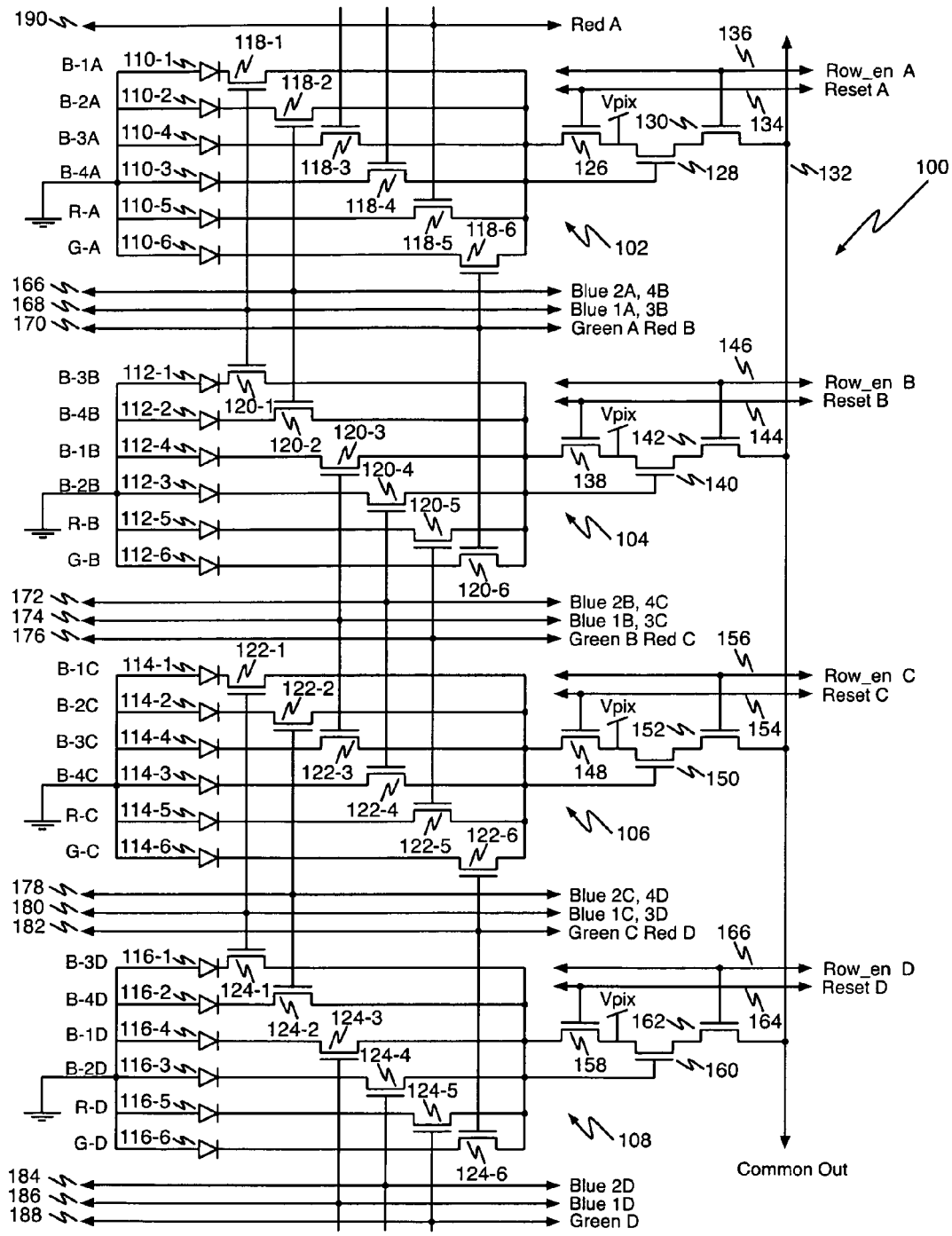
FIG. 3 is a schematic diagram of a portion of a column of multi-color CMOS pixel sensors according to another aspect of the present invention.

Referring now to FIG. 3, a schematic diagram shows a portion of an array 100 of multi-color CMOS pixel sensors according to another aspect of the present invention comprising a part of a single column of the array containing four multi-color CMOS pixel sensors 102, 104, 106, and 108. Each pixel sensor includes six photodiodes identified in FIG. 3 at reference numerals 110-1 through 110-6, 112-1 through 112-6, 114-1 through 114-6, and 116-1 through 116-6. The anode of each photodiode is coupled to ground.

The cathode of each photodiode is separately coupled to a source/drain terminal of an n-channel select transistor to form a photocharge collection node. In pixel sensor 102, transistors 118-1 through 118-6 are the select transistors for photodiodes 110-1 through 110-6 respectively. In pixel sensor 104, transistors 120-1 through 120-6 are the select transistors for photodiodes 112-1 through 112-6 respectively. In pixel sensor 106, transistors 122-1 through 122-6 are the select transistors for photodiodes 114-1 through 114-6 respectively. In pixel sensor 108, transistors 124-1 through 124-6 are the select transistors for photodiodes 116-1 through 116-6 respectively.

The output structure of the pixel sensors of FIG. 3 is different from the output structure of the pixel sensors of FIG. 1. In the embodiment shown in FIG. 3, an output structure employing a single column output line is employed as will now be described.

The other source/drain terminals of select transistors 118-1 through 118-6 are coupled to the source of reset transistor 126 and the gate of source-follower transistor 128. The drain of reset transistor 126 is coupled to a reset potential $V_{pix}$. The drain of source-follower transistor 128 is also coupled to the potential $V_{pix}$. The source of source-follower transistor 128 is coupled to the drain of an output-select transistor 130. The source of output-select transistor 130 is coupled to an output column line 132. The gate of reset transistor 126 is coupled to a reset line 134. The gate of output-select transistor 130 is coupled to a row-enable line 136.

The other source/drain terminals of select transistors 120-1 through 120-6 are coupled to the source of reset transistor 138 and the gate of source-follower transistor 140. The drain of reset transistor 138 is coupled to a reset potential $V_{pix}$. The drain of source-follower transistor 140 is also coupled to the potential $V_{pix}$. The source of source-follower transistor 140 is coupled to the drain of an output-select transistor 142. The source of output-select transistor 142 is coupled to the output column line 132. The gate of reset transistor 138 is coupled to a reset line 144. The gate of output-select transistor 142 is coupled to a row-enable line 146.

The other source/drain terminals of select transistors 122-1 through 122-6 are coupled to the source of reset transistor 148 and the gate of source-follower transistor 150. The drain of reset transistor 148 is coupled to a reset potential $V_{pix}$. The drain of source-follower transistor 150 is also coupled to the potential $V_{pix}$. The source of source-follower transistor 150 is coupled to the drain of an output-select transistor 152. The source of output-select transistor 152 is coupled to the output column line 132. The gate of reset transistor 148 is coupled to a reset line 154. The gate of output-select transistor 152 is coupled to a row-enable line 156.

The other source/drain terminals of select transistors 124-1 through 124-6 are coupled to the source of reset transistor 158 and the gate of source-follower transistor 160. The drain of reset transistor 158 is coupled to a reset potential $V_{pix}$. The drain of source-follower transistor 160 is also coupled to the potential $V_{pix}$. The source of source-follower transistor 160 is coupled to the drain of an output-select transistor 162. The source of output-select transistor 162 is coupled to the output column line 132. The gate of reset transistor 158 is coupled to a reset line 164. The gate of output-select transistor 162 is coupled to a row-enable line 166.

Three color-select lines are disposed adjacent to each row of pixel sensors in the array depicted in FIG. 3. Thus, color-select line 166 drives the gates of select transistors 118-2 and 120-2. Color-select line 168 drives the gates of select transistors 118-1 and 120-1. Color-select line 170 drives the gates of select transistors 118-6 and 120-6. Color-select line 172 drives the gates of select transistors 120-4 and 122-4. Color-select line 174 drives the gates of select transistors 120-3 and 122-3. Color-select line 176 drives the gates of select transistors 120-5 and 122-5. Color-select line 178 drives the gates of select transistors 122-2 and 124-2. Color-select line 180 drives the gates of select transistors 122-1 and 124-1. Color-select line 182 drives the gates of select transistors 122-6 and 124-6. Color-select line 184 drives the gate of select transistor 124-4 as well as the gate of a select transistor in the pixel sensor that is located below pixel sensor 108 and not shown in FIG. 3. Color-select line 186 drives the gate of select transistor 124-3 as well as the gate of a select transistor in the pixel sensor that is located below pixel sensor 108 and not shown in FIG. 3. Color-select line 188 drives the gate of select transistor 124-5 as well as the gate of a select transistor in the pixel sensor that is located below pixel sensor 108 and not shown in FIG. 3. Finally, color-select line 190, at the top of FIG. 3, drives the gate of select transistor 118-5 as well as the gate of a select transistor in the pixel sensor that is located above pixel sensor 102 and not shown in FIG. 3.

Figure 4:
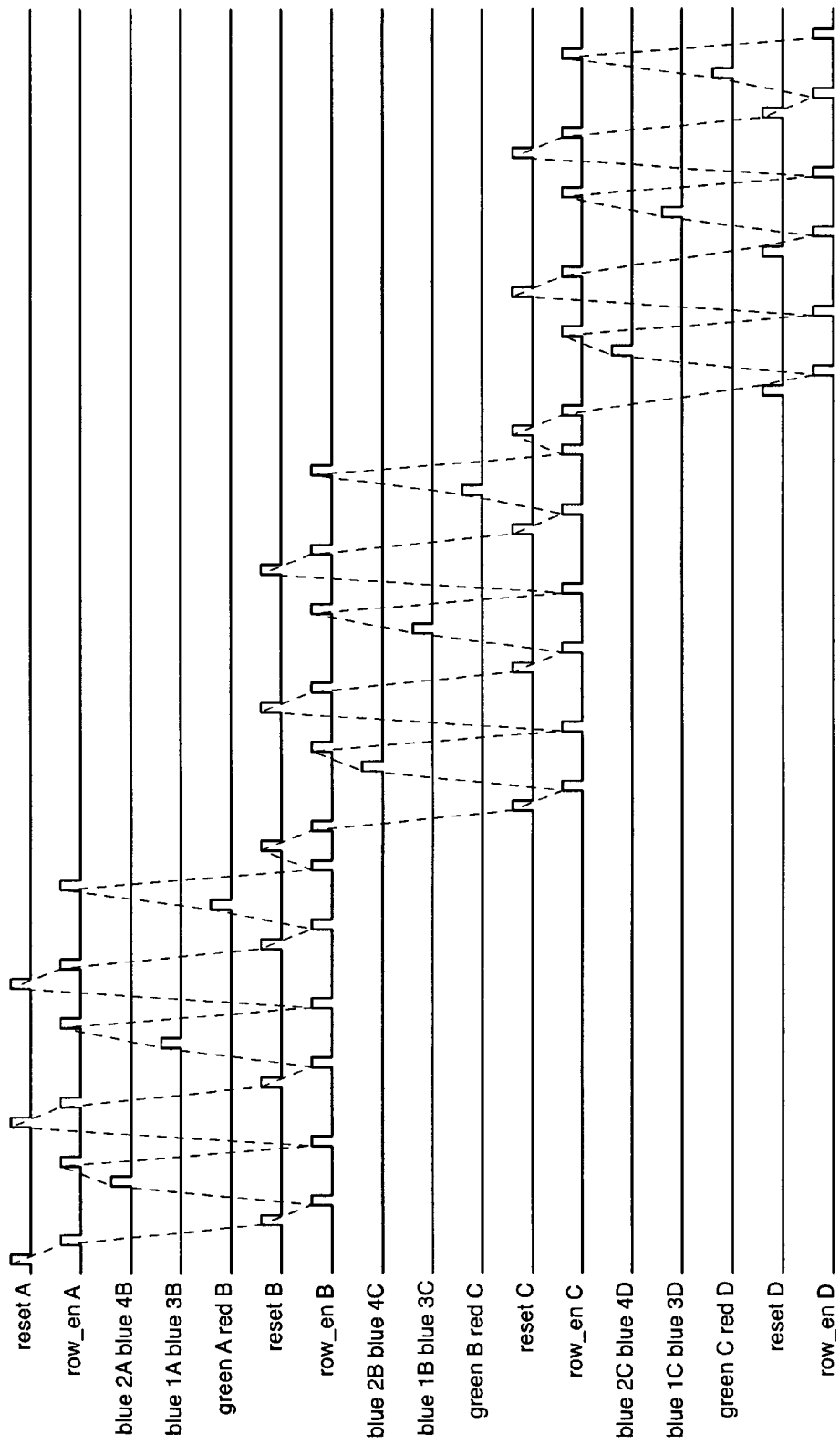
FIG. 4 is a timing diagram illustrating one method for operating the pixel sensor of FIG. 3.

FIG. 4 is a timing diagram illustrating one method for operating the pixel sensor of FIG. 3. The first, sixth, eleventh and sixteenth traces represent the signals on the reset lines 134, 144, 154, and 164 respectively. The third through fifth traces represent the signals on the sets of three color-select lines 166, 168 and 170 respectively. The eighth through tenth traces represent the signals on the sets of three color-select lines 172, 174 and 176 respectively. The thirteenth through fifteenth traces represent the signals on the sets of three color-select lines 178, 180 and 182 respectively. The second, seventh, twelfth, and seventeenth traces, respectively, represent the signals on the row-enable lines 136, 146, 156, and 166. The dashed line facilitates understanding the sequence of the signals depicted in FIG. 4.

Figure 5:
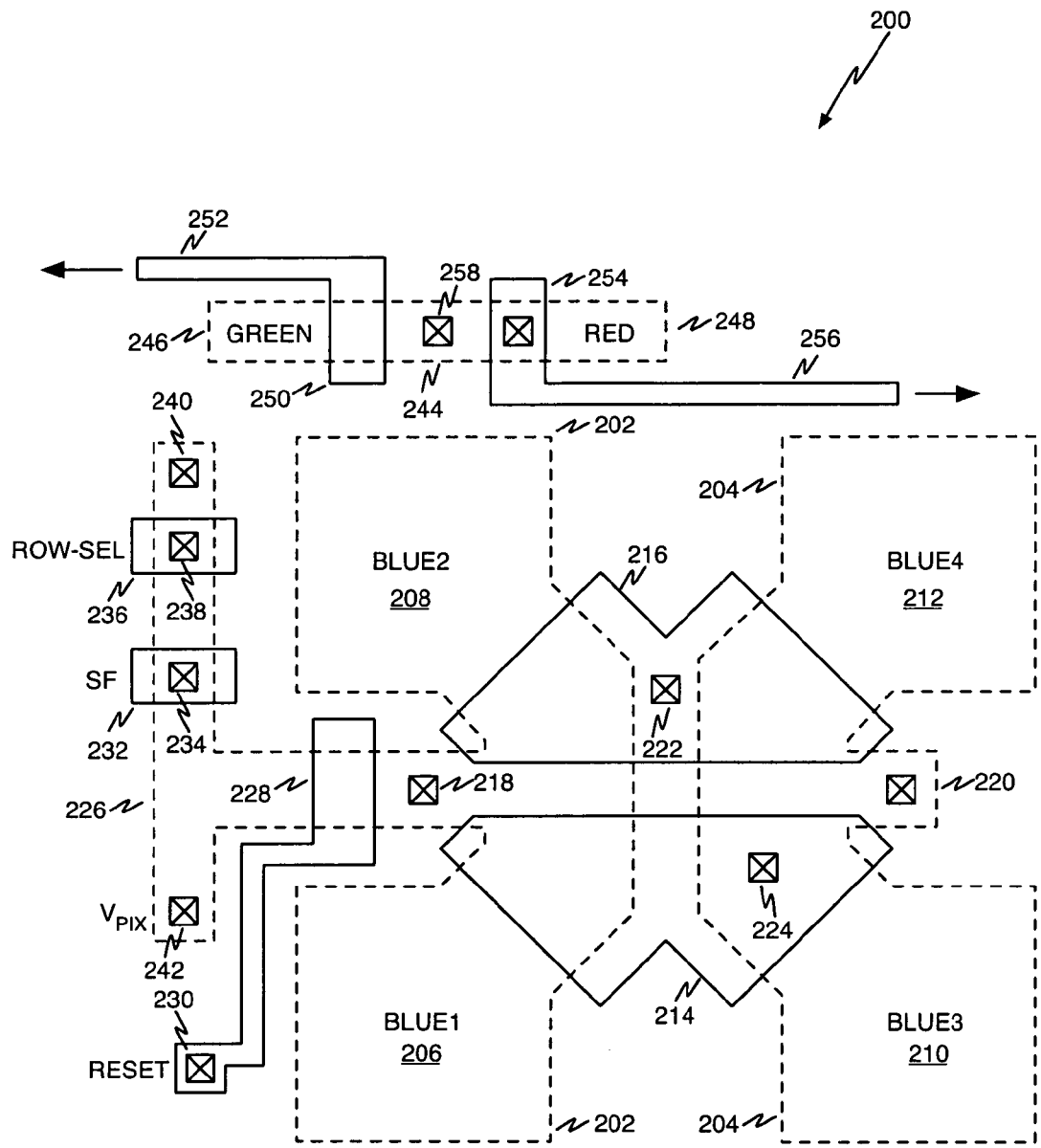
FIG. 5 is a top view of a portion of an illustrative semiconductor layout of a pixel sensor according to the principles of the present invention showing active semiconductor regions and a polysilicon layer.

Referring now to FIG. 5, a top view of a portion of an illustrative semiconductor layout of a pixel sensor 200 according to the principles of the present invention is shown. The layout depicted is for the pixel sensor shown in the schematic diagram of FIG. 3. The view of FIG. 5 shows active semiconductor regions and a polysilicon layer.

Pixel sensor 200 includes a first active region 202 and a second active region 204. First active region 202 includes a first blue detector (BLUE1) 206 and a second blue detector (BLUE2) 208. Second active region 204 includes a third blue detector (BLUE3) 210 and a second blue detector (BLUE4) 212.

A first polysilicon gate 214 overlies the lower portions of active region 202 and active region 204 to define color-select transistors for the first blue detector 206 and the third blue detector 210. A second polysilicon gate 216 overlies the upper portions of active region 202 and active region 204 to define color-select transistors for the second blue detector 208 and the fourth blue detector 212. A contact 218 makes contact first active region 202 in the source/drain region that is common to the color-select transistors for the first and second blue detectors 206 and 208. A contact region 220 makes contact with second active region 204 in the source/drain region that is common to the color-select transistors for the third and fourth blue detectors 210 and 212. A contact 222 makes contact with the first polysilicon gate 214 and a contact 224 makes contact with the second polysilicon gate 216.

An active region 226 is a contiguous extension of first active region 202. Polysilicon gate region 228 overlying active region 226 forms a gate for a reset transistor and includes gate contact 230. Polysilicon region 232 overlying active region 226 forms a gate for a source-follower transistor and includes gate contact 234. Polysilicon region 236 overlying active region 226 forms a gate for a row-select readout transistor and includes gate contact 238. Contact 240 makes contact to the output source/drain region of the row-select readout transistor. Contact 242 makes contact to the power-supply potential $V_{pix}$.

Active region 244 is coupled to the buried green and red detectors. In the pixel sensor 200, the green detector is coupled to region 246 and the red region is coupled to region 248. Polysilicon gate region 250 overlies active region 244 to define the green color-select transistor and an extension 252 of polysilicon gate region 250 couples this gate to the gate of a color-select transistor in an adjacent pixel sensor to the right of pixel sensor 200. Polysilicon gate region 254 overlies active region 244 to define the red color-select transistor and an extension 256 of polysilicon gate region 254 couples this gate to the gate of a color-select transistor in an adjacent pixel sensor to the right of pixel sensor 200. Contact 258 makes contact with the common source/drain regions of the green and red color-select transistors.

Figure 6:
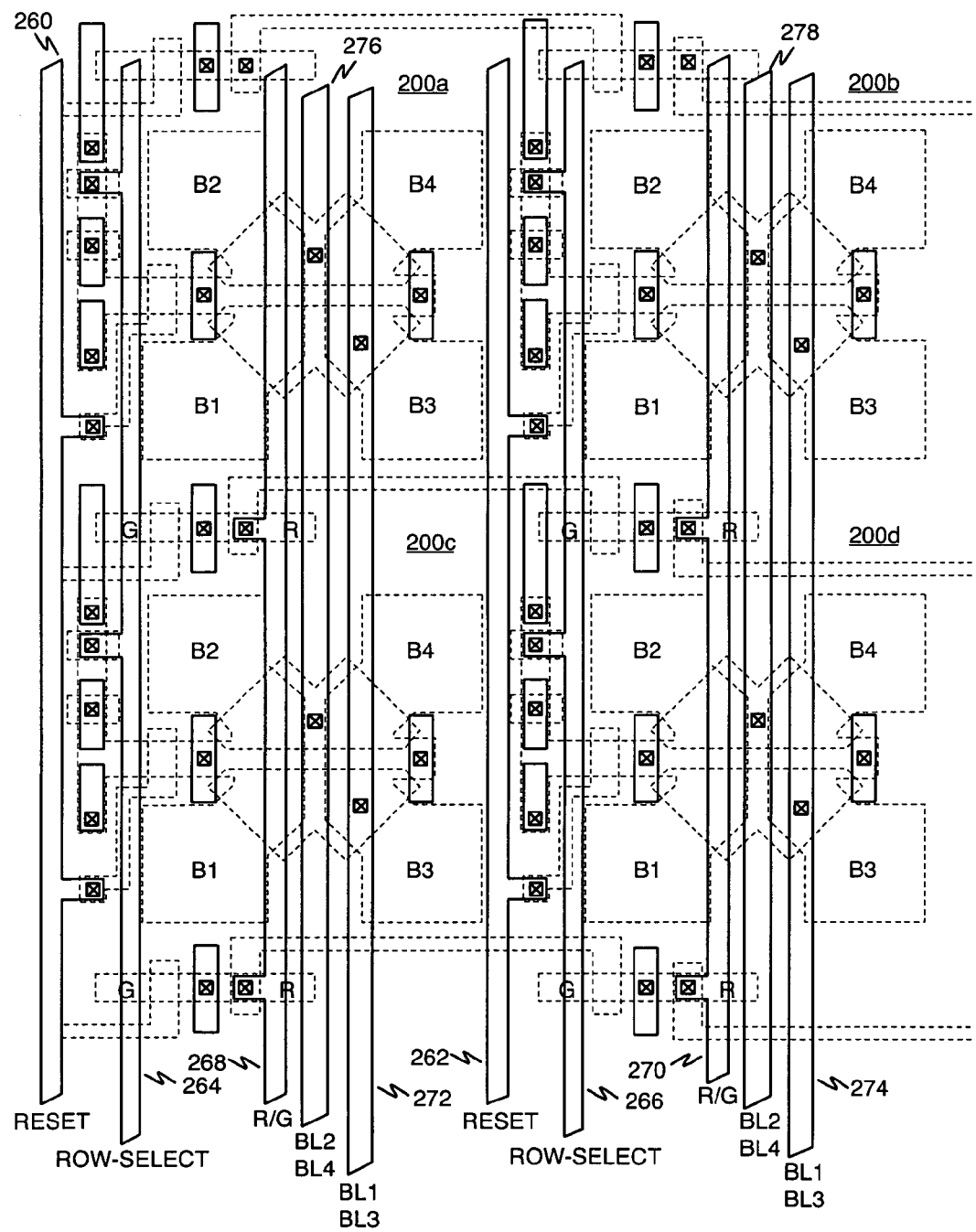
FIG. 6 is a top view of a portion of an illustrative semiconductor layout of a group of four pixel sensors according to the principles of the present invention showing active semiconductor regions, a polysilicon layer, and a first metal interconnect layer.
Figure 7:
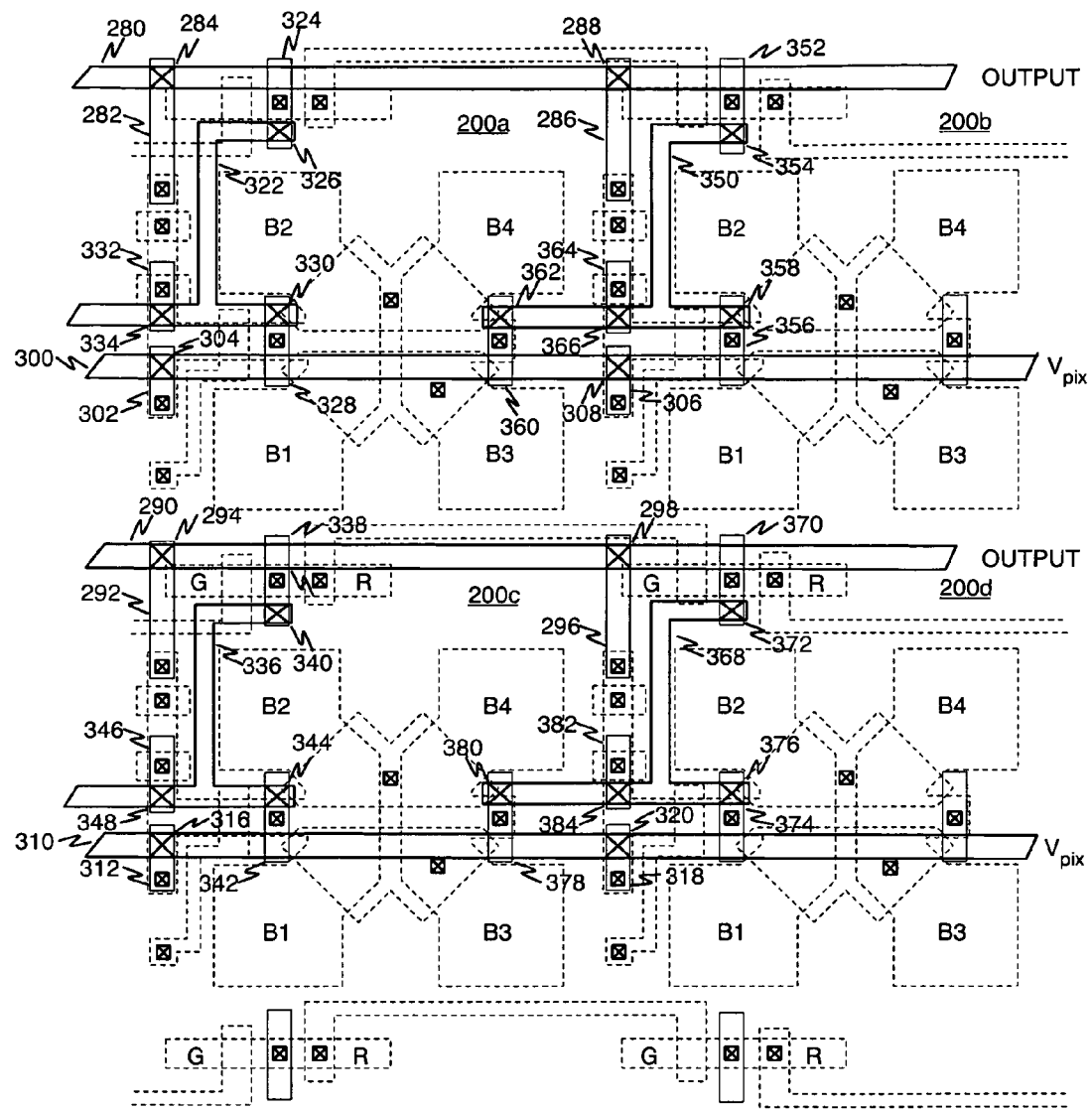
FIG. 7 is a top view of a portion of an illustrative semiconductor layout of a group of four pixel sensors according to the principles of the present invention showing active semiconductor regions, a polysilicon layer, a first metal interconnect layer, and a second metal interconnect layer.

Referring now to FIG. 6, aspects of the wiring of pixel sensors in an array according to the present invention is shown. FIG. 6 is a top view of a portion of an illustrative semiconductor layout of a group of four pixel sensors 200*a*, 200*b*, 200*c*, and 200*d* according to the principles of the present invention showing active semiconductor regions, a polysilicon layer, and a first metal interconnect layer. Persons of ordinary skill in the art will recognize that the four pixel sensors 200*a*, 200*b*, 200*c*, and 200*d* are identical to pixel sensor 200 shown in FIG. 5 and are shown in dashed lines of smaller line width than are the segments of interconnect metal shown in solid lines in FIG. 6. Other elements from FIG. 5 that are also shown in FIGS. 6 and 7 are identified by the reference numerals used in FIG. 5 followed by the appropriate one of the suffixes "a," "b," "c,", or "d," depending on which one of the four pixel sensors 200*a*, 200*b*, 200*c*, and 200*d* the element is associated.

Referring to both FIGS. 5 and 6, a reset metal line 260 is coupled to the gate 228 of the reset transistors in pixel sensors 200*a* and 200*c* through contact 230 in each of those pixel sensors. Another reset metal line 262 is coupled to the gate 228 of the reset transistors in pixel sensors 200*b* and 200*d* through contact 230 in each of those pixel sensors.

A row-select metal line 264 is coupled to the gate 236 of the row-select transistors in pixel sensors 200*a* and 200*c* through contact 238 in each of those pixel sensors. Another row-select metal line 266 is coupled to the gate 236 of the row-select transistors in pixel sensors 200*b* and 200*d* through contact 238 in each of those pixel sensors.

A red/green (R/G) color-select line 268 is coupled to the gates of the red color-select transistors in pixel sensors 200*a* and 200*c* and to the gates of the green color-select transistors in pixel sensors 200*b* and 200*d*. Another red/green (R/G) color-select line 270 is coupled to the gates of the red color-select transistors in pixel sensors 200*b* and 200*d* and to the gates of the green color-select transistors in pixel sensors located past the right edge of FIG. 6. Similarly, the gates of the green color-select transistors in pixel sensors in pixel sensors 200*a* and 200*c* are driven by a red/green (R/G) color-select line located past the left edge of FIG. 6 that also drives gates of the red color-select transistors in pixel sensors located past the left edge of FIG. 6.

A Blue1 (B1) and Blue3 (B3) color-select line 272 is coupled to the polysilicon region 214 that forms the gates of the blue-select transistors for the pixel sensors B1 and B3 in pixel sensors 200*a* and 200*c*. Another Blue1 (B1) and Blue3 (B3) color-select line 274 is coupled to the polysilicon region 214 that forms the gates of the blue-select transistors for the pixel sensors B1 and B3 in pixel sensors 200*b* and 200*d*.

A Blue2 (B2) and Blue4 (B4) color-select line 276 is coupled to the polysilicon region 216 that forms the gates of the blue-select transistors for the pixel sensors B2 and B4 in pixel sensors 200*a* and 200*c*. Another Blue2 (B2) and Blue4 (B4) color-select line 278 is coupled to the polysilicon region 216 that forms the gates of the blue-select transistors for the pixel sensors B2 and B4 in pixel sensors 200*b* and 200*d*.

Other metal interconnect segments that are shown in FIG. 6 are used to make connections to metal segments in the second metal interconnect layer that are shown in FIG. 7. These segments will be discussed with reference to FIG. 7.

FIG. 7 is a top view of a portion of an illustrative semiconductor layout of a group of four pixel sensors according to the principles of the present invention showing active semiconductor regions, a polysilicon layer, a first metal interconnect layer, and a second metal interconnect layer. As in FIG. 6, the four pixel sensors 200a, 200b, 200c, and 200d are identical to pixel sensor 200 of FIG. 5 and are shown in dashed lines of smaller line width. In addition, the metal interconnect segments of FIG. 5 are also shown in FIG. 6 as solid lines but are drawn with lines of smaller width than are the segments of the second interconnect metal shown in heavier solid lines in FIG. 7.

Referring to FIGS. 5, 6, and 7, an output line 280 in the second metal interconnect layer is connected to metal interconnect line segment 282 in the first metal interconnect layer through intermetal via 284. Metal interconnect line segment 282 is connected to the output node of the row-select transistor of pixel sensor 200a through its contact 240. Output line 280 is also connected to metal interconnect line segment 286 in the first metal interconnect layer through intermetal via 288. Metal interconnect line segment 286 is connected to the output node of the row-select transistor of pixel sensor 200b through its contact 240. Similarly, another output line 290 in the second metal interconnect layer is connected to metal interconnect line segment 292 in the first metal interconnect layer through intermetal via 294. Metal interconnect line segment 292 is connected to the output node of the row-select transistor of pixel sensor 200c through its contact 240. Output line 290 is also connected to metal interconnect line segment 296 in the first metal interconnect layer through intermetal via 298. Metal interconnect line segment 296 is connected to the output node of the row-select transistor of pixel sensor 200d through its contact 240.

A $V_{pix}$ power line 300 in the second metal interconnect layer is connected to metal interconnect line segment 302 in the first metal interconnect layer through intermetal via 304. Metal interconnect line segment 302 is connected to the $V_{pix}$ node in pixel sensor 200a through its contact 242a. $V_{pix}$ power line 300 in the second metal interconnect layer is also connected to metal interconnect line segment 306 in the first metal interconnect layer through intermetal via 308. Metal interconnect line segment 306 is connected to the $V_{pix}$ node in pixel sensor 200b through its contact 242b.

Another $V_{pix}$ power line 310 in the second metal interconnect layer is connected to metal interconnect line segment 312 in the first metal interconnect layer through intermetal via 316. Metal interconnect line segment 316 is connected to the $V_{pix}$ node in pixel sensor 200c through its contact 242c. $V_{pix}$ power line 310 in the second metal interconnect layer is also connected to metal interconnect line segment 318 in the first metal interconnect layer through intermetal via 320. Metal interconnect line segment 318 is connected to the $V_{pix}$ node in pixel sensor 200d through its contact 242d.

A color-transfer connect metal line 322 in the second metal interconnect layer is connected to metal interconnect line 324 in the first metal interconnect layer through intermetal via 326. Metal interconnect line 324 in the first metal interconnect layer is connected to the common source/drain portion of active region 244 in pixel sensor 200a through its contact 258 to pick up the red and green detector outputs. Color-transfer connect metal line 322 in the second metal interconnect layer is also connected to metal interconnect line 328 in the first metal interconnect layer through intermetal via 330. Metal interconnect line 328 is connected to the common source/drain portion of the active region 202 in pixel sensor 200a to couple the B1 and B2 blue color signals through its contact 218. Color-transfer connect metal line 322 in the second metal interconnect layer is also connected to metal interconnect line 332 through intermetal via 334. Metal interconnect line 332 is coupled to the gate of the source-follower transistor in pixel sensor 200a through its contact 234. Color-transfer metal line 322 is also connected through an intermetal via to a metal interconnect line that makes contact to the B3 and B4 blue color signals in a pixel sensor that is located next to pixel sensor 200a past the left edge of FIG. 7.

Another color-transfer connect metal line 336 in the second metal interconnect layer is connected to metal interconnect line 338 in the first metal interconnect layer through intermetal via 340. Metal interconnect line 338 in the first metal interconnect layer is connected to the common source/drain portion of active region 244 in pixel sensor 200c through its contact 258 to pick up the red and green detector outputs. Color-transfer connect metal line 336 in the second metal interconnect layer is also connected to metal interconnect line 342 in the first metal interconnect layer through intermetal via 344. Metal interconnect line 342 is connected to the common source/drain portion of the active region 202 in pixel sensor 200c to couple the B1 and B2 blue color signals through its contact 218. Color-transfer connect metal line 336 in the second metal interconnect layer is also connected to metal interconnect line 346 through intermetal via 348. Metal interconnect line 346 is coupled to the gate of the source-follower transistor in pixel sensor 200c through its contact 234.

Another color-transfer connect metal line 350 in the second metal interconnect layer is connected to metal interconnect line 352 in the first metal interconnect layer through intermetal via 354. Metal interconnect line 352 in the first metal interconnect layer is connected to the common source/drain portion of active region 244 in pixel sensor 200b through its contact 258 to pick up the red and green detector outputs. Color-transfer connect metal line 350 in the second metal interconnect layer is also connected to metal interconnect line 356 in the first metal interconnect layer through intermetal via 358. Metal interconnect line 356 is connected to the common source/drain portion of the active region 202 in pixel sensor 200b to couple the B1 and B2 blue color signals of pixel sensor 200b through its contact 218.

Color-transfer connect metal line 350 in the second metal interconnect layer is also connected to metal interconnect line 360 in the first metal interconnect layer through intermetal via 362. Metal interconnect line 360 is connected to the common source/drain portion of the active region 204 in pixel sensor 200a to couple the B3 and B4 blue color signals of pixel sensor 200a through its contact 220. Color-transfer connect metal line 350 in the second metal interconnect layer is also connected to metal interconnect line 364 through intermetal via 366. Metal interconnect line 364 is coupled to the gate of the source-follower transistor in pixel sensor 200b through its contact 234.

Another color-transfer connect metal line 368 in the second metal interconnect layer is connected to metal interconnect line 370 in the first metal interconnect layer through intermetal via 372. Metal interconnect line 370 in the first metal interconnect layer is connected to the common source/drain portion of active region 244 in pixel sensor 200d through its contact 258 to pick up the red and green detector outputs. Color-transfer connect metal line 368 in the second metal interconnect layer is also connected to metal interconnect line 374 in the first metal interconnect layer through intermetal via 376. Metal interconnect line 374 is connected to the common source/drain portion of the active region 202 in pixel sensor 200d to couple the B1 and B2 blue color signals of pixel sensor 200d through its contact 218.

Color-transfer connect metal line 368 in the second metal interconnect layer is also connected to metal interconnect line 378 in the first metal interconnect layer through intermetal via 380. Metal interconnect line 378 is connected to the common source/drain portion of the active region 204 in pixel sensor 200c to couple the B3 and B4 blue color signals of pixel sensor 200c through its contact 220. Color-transfer connect metal line 368 in the second metal interconnect layer is also connected to metal interconnect line 382 through intermetal via 384. Metal interconnect line 382 is coupled to the gate of the source-follower transistor in pixel sensor 200d through its contact 234.

As will be appreciated by persons of ordinary skill in the art, the wiring scheme for the pixel sensor array, a portion of which is depicted in FIGS. 3, 6 and 7, reads out image information from portions of more than one pixel and by doing so, decreases the number of interconnect metal lines that must be employed for this purpose.

While embodiments and applications of this invention have been shown and described, it would be apparent to those skilled in the art that many more modifications than mentioned above are possible without departing from the inventive concepts herein. For example, the illustrative embodiments shown for stacked pixel architectures, but they can also be used for pixel architectures that share the photocharge collection node for multiple photosensors. The invention, therefore, is not to be restricted except in the spirit of the appended claims.

What is claimed is:

1. An array of CMOS pixel sensors, each pixel sensor associated with a row and a column of the array and having a plurality of photosensors per pixel location, each photosensor coupled to a single sense node through a select transistor having a select input, each pixel sensor including a reset transistor coupled to the sense node and having a reset input, an amplifier transistor coupled to the sense node and a row-select transistor coupled to the amplifier, wherein:
   the select inputs for pixel sensors in a pair of adjacent rows are coupled to select signal lines associated with only that pair of rows;
   the reset inputs for pixel sensors in each row is coupled to reset signal lines associated with that row;
   the amplifier transistors in individual columns of each row are coupled to a column output line through a row-select transistor having a row-select input; and
   the row-select inputs for pixel sensors in each row of the array are coupled to a row-select line associated with the row.

2. The array of claim 1 wherein the select signal lines, the reset signal lines and the row-select lines run in a row direction of the array and the column output line runs in a column direction of the array.

3. The array of claim 2 wherein the amplifier in each pixel sensor is a source-follower transistor having its drain coupled to a source-follower drain potential node, the source-follower drain potential node for each pixel sensor in a row in the array coupled to a source-follower drain potential line and running in the column direction of the array.

4. The array of claim 2 wherein the amplifier in each pixel sensor is a source-follower transistor having its drain coupled to a source-follower drain potential node, the source-follower drain potential node for each pixel sensor in a row in the array coupled to a source-follower drain potential line associated with that row and running in the row direction of the array.

* * * * *